US005726069A

United States Patent [19]

Chen et al.

[11] Patent Number: 5,726,069
[45] Date of Patent: Mar. 10, 1998

[54] USE OF OBLIQUE IMPLANTATION IN FORMING EMITTER OF BIPOLAR TRANSISTOR

[75] Inventors: Hung-Sheng Chen; Chih Sieh Teng, both of San Jose, Calif.

[73] Assignee: National Semiconductor Corporation, Santa Clara, Calif.

[21] Appl. No.: 348,629

[22] Filed: Dec. 2, 1994

[51] Int. Cl.⁶ .................................................. H01H 21/265
[52] U.S. Cl. ................................ 437/31; 437/26; 437/35
[58] Field of Search ........................... 437/31, 35, 26

[56] References Cited

U.S. PATENT DOCUMENTS

| | | | |
|---|---|---|---|
| 4,771,012 | 9/1988 | Yabu et al. | 437/35 |
| 5,183,768 | 2/1993 | Kameyama et al. | 437/31 |
| 5,288,652 | 2/1994 | Wang et al. | 437/31 |
| 5,302,535 | 4/1994 | Imai et al. | 437/31 |
| 5,308,780 | 5/1994 | Chou et al. | 437/35 |
| 5,342,794 | 8/1994 | Wei | 437/31 |

FOREIGN PATENT DOCUMENTS

| | | | |
|---|---|---|---|
| 0113474 | 5/1987 | Japan | 437/35 |
| 0145729 | 6/1987 | Japan | 437/35 |
| 62178265 | 1/1989 | Japan | 437/35 |
| 0082561 | 3/1989 | Japan | 437/31 |
| 0005428 | 1/1990 | Japan | 437/31 |
| 0148818 | 6/1991 | Japan | 437/35 |
| 404028236 | 1/1992 | Japan | 437/35 |
| 404113627 | 4/1992 | Japan | 437/31 |
| 404147627 | 5/1992 | Japan | 437/31 |
| 404155838 | 5/1992 | Japan | 437/35 |
| 404192337 | 7/1992 | Japan | 437/35 |
| 404254323 | 9/1992 | Japan | 437/35 |
| 405041385 | 2/1993 | Japan | 437/35 |
| 405062986 | 3/1993 | Japan | 437/35 |
| 405109643 | 4/1993 | Japan | 437/35 |
| 5109745 | 4/1993 | Japan | 437/31 |
| 5109748 | 4/1993 | Japan | 437/31 |
| 405129217 | 5/1993 | Japan | 437/35 |

OTHER PUBLICATIONS

Alvarez, *BiCMOS Technology and Applications* (Kluwer Acad Pub., 2d ed.), 1933, p. 76.

Honda et al, "Suppression of Hot Carrier Effects by Laterally Graded Emitter (LGE) Structure in BiCMOS," IEEE Int'l Elect. Devs. Meeting, 1990, pp. 9.5.1–9.5.4.

Burnett et al, "Bipolar Reliability Optimization through Surface Compensation of the Base Profile," IEEE Int'l Reliability Physics Symp., 31 Mar. –2 Apr. 1992, pp. 107–111.

*Primary Examiner*—John Niebling
*Assistant Examiner*—Long Pham
*Attorney, Agent, or Firm*—Skjerven, Morrill, MacPherson, Franklin & Friel LLP; Ronald J. Meetin

[57] ABSTRACT

A bipolar transistor is fabricated by a process in which first and second dopants of the same conductivity type are introduced into a semiconductor body through at least partially overlapping sections, preferably the same section, of the body's upper surface to form an emitter. The first dopant is introduced at a greater dosage than the second dopant such that the emitter consists at least of a main emitter region constituted primarily with the first dopant. The introduction of the second dopant into the body entails ion implanting the second dopant at a tilt angle of at least 15° relative to a direction generally perpendicular to the body's upper surface. Part of the second dopant is so implanted into an extension zone that extends laterally beyond the main emitter region. The extension zone may be of the same conductivity type as, or of opposite conductivity type to, the main emitter region. In either case, the extension zone is lightly doped and reduces transistor performance degradation by reducing the electric field along the emitter-base junction, especially along the upper semiconductor surface.

40 Claims, 11 Drawing Sheets

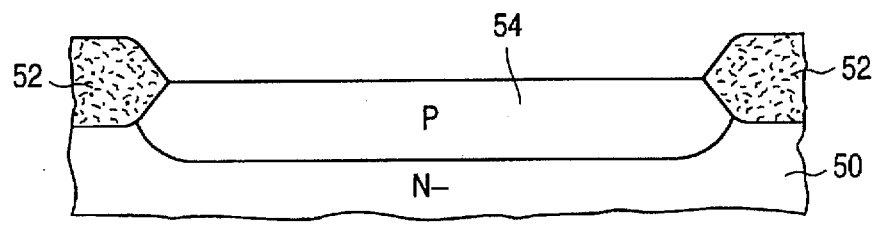
Fig. 4a
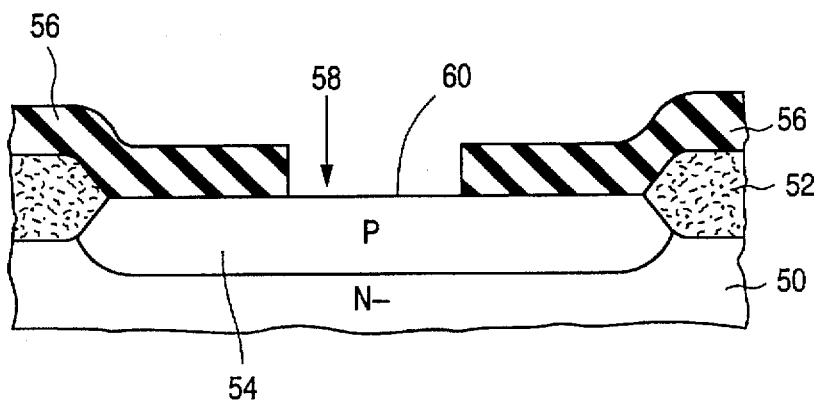
Fig. 4b
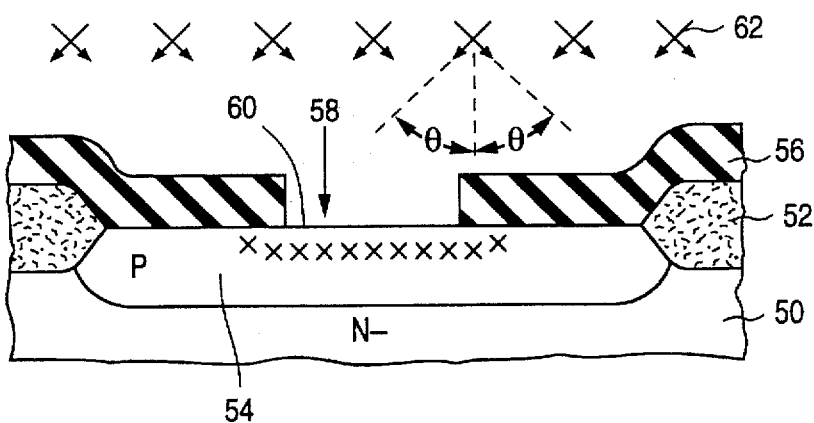
Fig. 4c
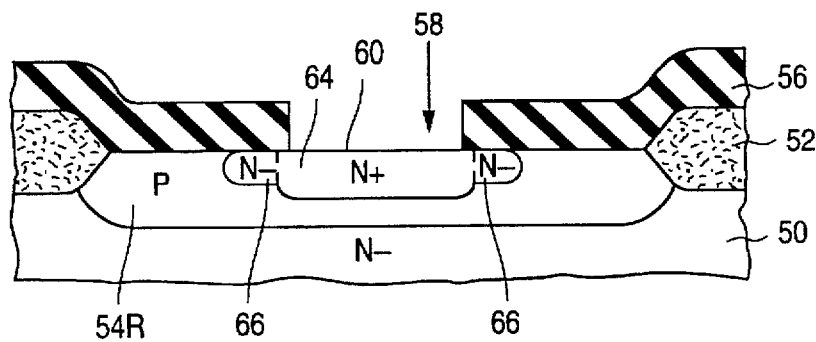
Fig. 4d1

Fig. 4d2

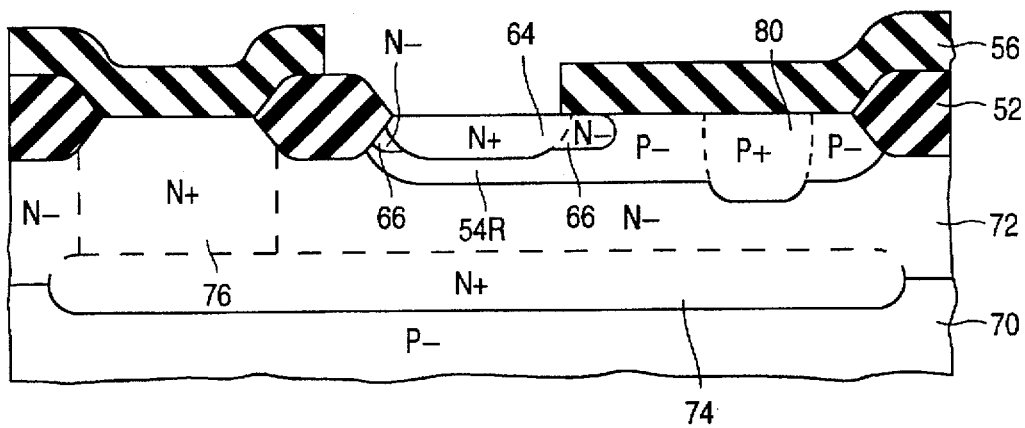
Fig. 6g1
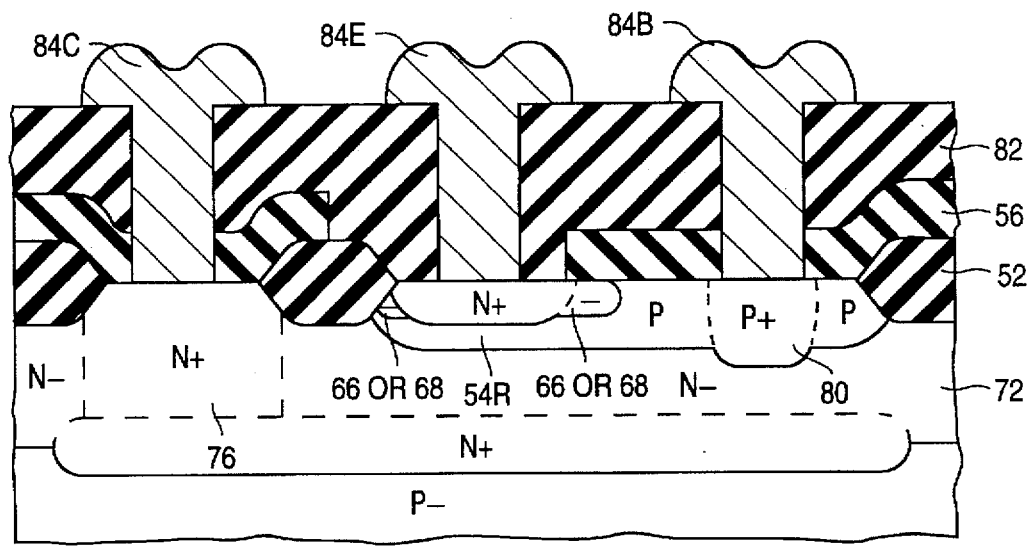
Fig. 6h
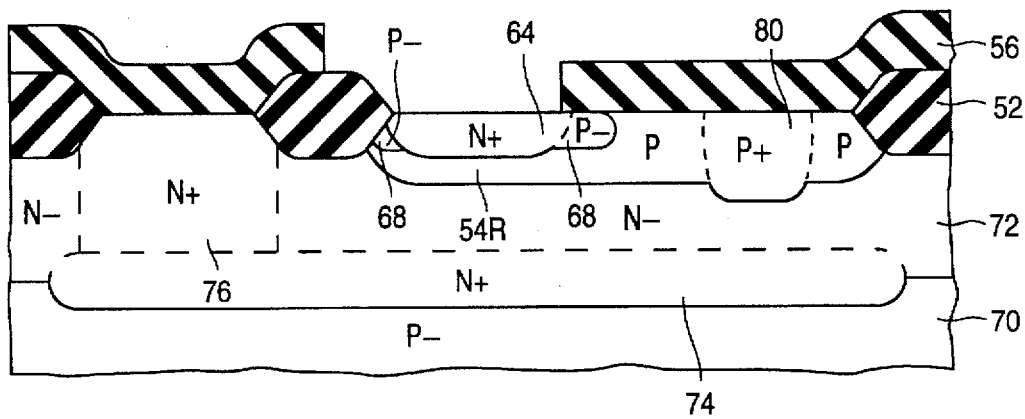
Fig. 6g2

USE OF OBLIQUE IMPLANTATION IN FORMING EMITTER OF BIPOLAR TRANSISTOR

FIELD OF USE

This invention relates to semiconductor devices. More particularly, this invention relates to methods of fabricating bipolar transistors.

BACKGROUND ART

A bipolar transistor consisting of an emitter, a collector, and an intervening base is commonly formed in a vertical arrangement along a major surface, here termed the upper surface, of a semiconductor body. Referring to the drawings, FIG. 1 illustrates a conventional vertical NPN transistor of the type described in Alvarez, *BiCMOS Technology and Applications* (Kluwer Acad Pub., 2d ed.), 1993, page 76. The transistor in FIG. 1 is created from a silicon semiconductor body consisting of P− substrate 10 and overlying N epitaxial layer 12. N+ buried layer 14 lies along the metallurgical interface between substrate 10 and epitaxial layer 12. Field-oxide region 16 is partially sunk into the semiconductor body along the upper surface of epitaxial layer 12. Field oxide 16 divides an upper portion of layer 12 into a group of laterally separated device regions, two of which are shown in FIG. 1.

The emitter and base are situated in the left-hand device region in FIG. 1. The emitter consists of N+ emitter region 18. The base is formed with P− main base region 20 and P+ base contact zone 22. The collector consists of N+ buried layer 14 and the directly overlying N-type portion of epitaxial layer 12, including N+ collector contact zone 24. Electrically insulating material (not shown) lies on top of the structure. Electrical contacts (also not shown) extend through this insulating material to contact silicon surface regions 18, 22, and 24.

The transistor in FIG. 1 is referred to as a vertical device because the emitter-to-collector current generally flows across the base in the vertical direction when the emitter-base junction is forward biased. That is, electrons in emitter region 18 move downward across the thin intrinsic part of base region 20 and then through the underlying part of epitaxial layer 12 down to buried layer 14. The electrons subsequently move laterally along layer 14 and then upward through collector contact zone 24 to the upper semiconductor surface.

Even though the large majority of the electron flow across the emitter-base junction of the transistor in FIG. 1 occurs through the generally horizontal portion of the junction, the region extending along the edge of the emitter-base junction at the upper surface of the semiconductor body is a critical part of the transistor. Electrons are accelerated by the electric field along the emitter-base junction near the upper semiconductor surface. Some of these electrons move upward towards the upper semiconductor surface and attain enough energy to create surface states along the upper semiconductor surface or become trapped in the insulating material overlying the emitter-base junction. This hot-carrier effect becomes more pronounced when the emitter-base junction is reverse biased. The hot-carrier effect is undesirable because the surface states and trapped electrons cause certain transistor performance parameters, such as current gain and cut-off frequency to drift, thereby degrading transistor performance.

A common objective in designing a bipolar transistor is to reduce the lateral area occupied by the transistor. Lateral downscaling of transistor dimensions is typically accompanied by vertical downscaling. Punch-through needs to be avoided in reducing the vertical transistor dimensions. At punch-through, the depletion region of the collector-base junction extends to the depletion region of the emitter-base junction. The diffusion-limited quasi-neutral zone normally situated between the two depletion regions is eliminated, thereby allowing the collector-to-emitter current to increase rapidly in an undesirable manner as the magnitude of the collector-to-emitter voltage is raised.

One technique for avoiding punch-through in designing a downscaled bipolar transistor is to increase the dopant concentration in the intrinsic base region. However, doing so typically causes the magnitude of the electric field along the emitter-base junction to increase, particularly near the upper semiconductor surface. This, in turn, leads to transistor performance degradation as a result of the hot-carrier effect described above.

Honda et al, "Suppression of Hot Carrier Effects by Laterally Graded Emitter (LGE) Structure in BiCMOS," IEEE Int'l Elect. Devs. Meeting, 1990, pages 9.5.1–9.5.4, describes a vertical NPN transistor that utilizes a laterally graded emitter ("LGE") to suppress the hot-carrier effect and reduce transistor performance degradation. FIG. 2 shows the LGE structure of Honda et al. Reference symbols 10–24 in FIG. 2 indicate the same elements as in FIG. 1, except that base contact zone 22 extends lower than main base region 20, and collector contact zone 24 is on the left instead of the right.

The emitter in FIG. 2 consists of main N+ emitter region 18 and an N− emitter extension 26 situated alongside main emitter region 18. Electrically insulating layer 28 and a pair of electrically insulating sidewall spacers 30 overlie the emitter. Metallic contacts 32B, 32C, and 32E extend through insulating layers 34 and 28 down to base contact zone 22, collector contact zone 24, and polysilicon emitter contact 36.

N− emitter extension 26 reduces the magnitude of the electric field along the emitter-base junction. Fewer electrons that are accelerated by the electric field near the upper semiconductor surface attain sufficient energy to create surface states or become trapped in the overlying insulating material. Less drift in the current gain and cut-off frequency occurs during transistor operation, particularly when the emitter-base junction is reversed biased. This provides latitude for increasing the base doping to maintain or improve performance as the transistor dimensions are vertically downscaled.

FIGS. 3a–3d illustrate how lightly doped emitter extension 26 is created in the LGE transistor of Honda et al. At the stage shown in FIG. 3a, P− precursor base region 38 and P+ base contact zone 22 have been provided, and opening 40 has been etched through insulating layer 28 down to precursor region 38. Phosphorus is introduced through opening 40 into region 38 at a low dosage to form N− emitter region 42 as shown in FIG. 3b.

Sidewall spacers 30 are subsequently formed along the edges of insulating layer 28 to reduce the size of opening 40. See FIG. 3c. Arsenic is then introduced through reduced-size opening 40 into regions 38 and 44 to form N+ main emitter region 18 as depicted in FIG. 3d. N− emitter extension 26 is the remainder of lightly doped emitter region 42. P− main base region 20 is the remainder of precursor region 38.

The LGE transistor structure of Honda et al is generally quite advantageous. However, as transistor dimensions are downscaled, significant manufacturability problems are likely to arise with the procedure employed by Honda et al to create the LGE structure. For example, due to the use of sidewall spacers 30, the phosphorus doping utilized in creating emitter zone 44, and thus in creating emitter extension 26, must be done before the arsenic doping employed in creating main N+ base region 18. However, phosphorus diffuses considerably faster than arsenic. Any high-temperature operation used in forming arsenic-doped main emitter region 18 thus causes the already-present phosphorus to diffuse downward at a faster rate than the arsenic. Emitter extension 26 can readily come unacceptably close to the base-collector junction.

Also, the size of main emitter region 18 depends on the lateral width of spacers 30 and thus on how spacers 30 are formed. If deposition of an insulating layer followed by an anisotropic etchback is utilized to form spacers 30, the spacer width typically does not decrease when the length (measured in the same direction as the spacer width) of main emitter region 18 is reduced unless the vertical thickness of the deposited insulating layer is also reduced. The ability to control spacer width during etchback usually becomes more difficult as the thickness of the deposited insulating layer is reduced. More variation in spacer width occurs. This limits the ability to downscale the transistor dimensions.

Burnett et al, "Bipolar Reliability Optimization through Surface Compensation of the Base Profile," IEEE Int'l Reliability Physics Symp., 31 Mar.–2 Apr. 1992, pages 107–111, describes an NPN transistor fabrication process similar to that used by Honda et al, including a low-dosage N-type ion implantation to form an extension zone continuous with the transistor's emitter. The main difference is that the N-type doping level of the extension-zone implant is not high enough to overcome the base doping in the extension zone. Consequently, the extension zone is a P− region—i.e., a lightly doped base portion—that adjoins the emitter rather than being a lightly doped extension of the emitter. As in Honda et al, the low-dosage extension-zone implant reduces the electric field along the emitter-base junction. The hot-carrier effect is substantially suppressed, thereby reducing transistor performance degradation.

Burnett et al performs the extension-zone implant through the mask employed for doping the base. Although this avoids an extra masking operation, the extension zone extends laterally across nearly the entire base. As a result, the base current is significantly increased, thereby causing the transistor current gain (beta) to be correspondingly reduced.

It would be desirable to have a technique by which a lightly-doped extension zone of a selected conductivity type could be created along a main emitter region of a bipolar transistor to reduce the electric field along the emitter-base junction, especially near the upper semiconductor surface, without incurring the spacer-associated problems of Honda et al or the beta-degradation problems of Burnett et al.

GENERAL DISCLOSURE OF THE INVENTION

The present invention furnishes such a fabrication technique. In the invention, oblique ion implantation is employed in providing a vertical bipolar transistor with a lightly doped extension zone situated along a main emitter region. The extension zone can be of the same conductivity type as, or of opposite conductivity type to, the main emitter region.

No spacers need be utilized in forming the lightly doped extension zone. The size of the extension zone can be readily controlled by suitably adjusting the implant angle in accordance with the invention so that the extension zone extends laterally across only a small portion of the transistor's base. Consequently, the presence of the extension zone does not cause the base current to be changed significantly. Hence, there is little to no degradation in the transistor current gain.

The dimensions of the present transistor can readily be scaled down to increase device packing density without incurring performance degradation due to the generation of hot carriers in the vicinity of the emitter-base junction. In short, the present manufacturing technique attains the advantages of the prior art but avoids its disadvantages.

More particularly, in accordance with the invention, a bipolar transistor is fabricated by a process in which first and second dopants of the same conductivity type are introduced into a semiconductor body through at least partially overlapping sections of its upper surface to form a surface-adjoining emitter. The first dopant is introduced into the semiconductor body at a greater dosage than the second dopant. As a result, the emitter consists at least of a main emitter region constituted primarily with the first dopant. Inasmuch as the first and second dopants pass through at least partially overlapping sections of the upper semiconductor surface, the main emitter region usually includes some of the second dopant.

The introduction of the second dopant into the semiconductor body entails ion implanting the second dopant in such a way that part of the second dopant is implanted into an extension zone that extends laterally beyond the location of the main emitter region. This is accomplished by performing the implant at a tilt angle of at least 15°, preferably at least 20°, relative to a direction generally perpendicular to the upper surface of the semiconductor body.

The first and second dopants are preferably introduced into the semiconductor body through substantially the same section of the upper semiconductor surface using the same doping shield. This avoids the necessity to perform a second masking operation for the extension zone implant. Also, the extension zone is self-aligned to the main emitter region.

Spacers are not needed to laterally offset the lightly doped extension zone from the main emitter region. The highly oblique nature of the implantation of the second dopant is relied upon for creating the lightly doped extension zone alongside the main emitter region. Furthermore, the extension zone normally laterally surrounds the main emitter region.

During the transistor fabrication process, additional dopant is introduced into the semiconductor body to provide the transistor with a base. The additional dopant is of opposite conductivity type to the first and second dopants. When the doping provided by the second dopant in the extension zone is sufficient to overcome the dopant provided by the additional dopant in the extension zone, the extension zone is normally of the same conductivity type as the main emitter region. The extension zone then constitutes a more lightly doped part of the emitter. The converse arises when the doping provided by the second dopant in the extension zone is not sufficient to overcome the doping provided by the further dopant in the extension zone. In this case, the extension zone is normally of the same conductivity type as the base and, in particular, forms a more lightly doped part of the base.

The introduction of the first dopant into the semiconductor body can be initiated before or after the implantation of the second dopant. Advantages arise with either sequence depending on other facets of the transistor fabrication process.

In an implementation where introduction of the first dopant into the semiconductor body is initiated before implantation of the second dopant, the first dopant can also be ion implanted. The semiconductor body is then annealed to activate the first dopant and repair implant lattice damage. After the anneal is completed, the oblique implantation of the second dopant is performed.

Arsenic and phosphorus are typically employed as the respective first and second dopants in the foregoing process implementation. Accordingly, the process sequence for creating the main emitter region and extension zone entails implanting arsenic, annealing, and subsequently implanting phosphorus. Because the anneal to activate the arsenic is done before the phosphorus implant, the arsenic anneal does not cause undesirable downward diffusion of the phosphorus-doped extension zone. The invention thus overcomes the processing sequence limitations that occur in Honda et al as the result of using spacers. In particular, a phosphorus-doped emitter extension can be created after, rather than before, the arsenic anneal so as to avoid having the lightly doped emitter extension get too close to the base-collector junction. Also, the depth of the emitter-base junction is reduced, thereby desirably reducing the junction capacitance.

In an implementation where introduction of the first dopant is performed after implantation of the second dopant, the first dopant is typically out-diffused from a doping layer provided over the upper semiconductor surface. For example, the doping layer can be formed with non-monocrystalline semiconductor material such as polysilicon or amorphous silicon. The fabrication technique of the invention can therefore be employed in a "poly emitter" fabrication process having one or more layers of polysilicon.

The lightly doped extension zone, regardless of its conductivity type, causes the magnitude of the electric field along the emitter-base junction to be reduced, especially near the upper semiconductor surface. Fewer hot carriers are generated near the upper semiconductor surface, thereby substantially decreasing the number of surface states that are created along the upper semiconductor surface and substantially reducing the number of electrons that become trapped in overlying insulating material. Drift in transistor performance parameters such as current gain and cut-off frequency is substantially reduced. The invention thus provides a substantial improvement over the prior art.

BRIEF DESCRIPTION OF THE DRAWINGS

FIGS. 4a, 4b, 4c, and 4d1 are cross-sectional views representing steps in fabricating a vertical bipolar transistor in accordance with the invention. FIG. 4d2 is a cross-sectional view representing an alternative step to that of FIG. 4d1 in fabricating a vertical bipolar transistor in accordance with the invention.

FIGS. 6a, 6b, 6c, 6d, 6e, 6f, 6g1, and 6h are cross-sectional views of a specific implementation of the inventive process of FIGS. 4a–4c and 4d1. FIG. 6g2 is a cross-sectional view of an alternative intermediate structure to that of FIG. 6g1. FIG. 6g2 specifically corresponds to the alternative step of FIG. 4d2.

Like reference symbols are employed in the drawings and in the description of the preferred embodiments to represent the same or very similar item or items.

DESCRIPTION OF THE PREFERRED EMBODIMENTS

Figure 1:
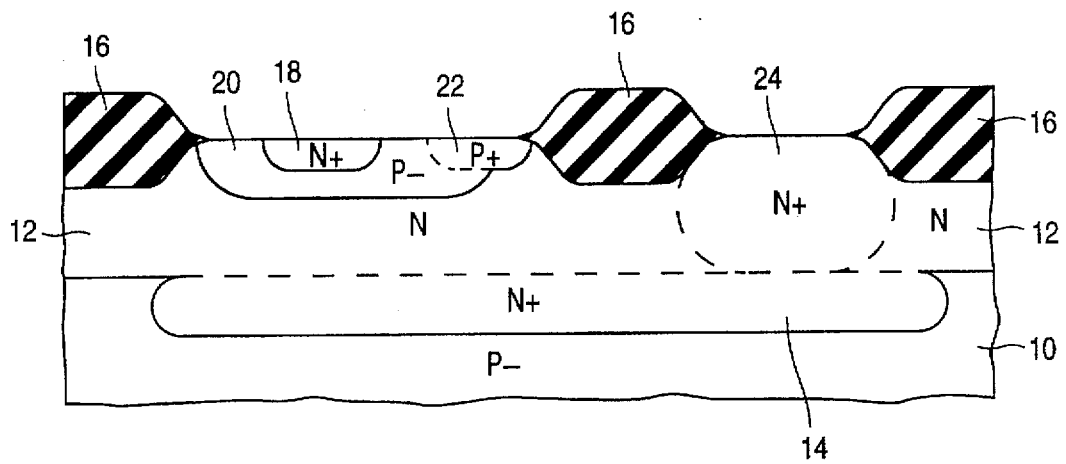
FIGS. 1 and 2 are cross-sectional views of prior art vertical bipolar transistors.

FIGS. 4a–4c and 4d1 or 4d2 (collectively "FIG. 4") illustrate generally how a lightly doped extension zone is provided along a main emitter region of a vertical NPN bipolar transistor in accordance with the teachings of the invention. FIGS. 4a–4c and 4d1 apply to the case in which the main emitter region and the extension zone are of the same conductivity type. FIGS. 4a–4c and 4d2 apply to the case in which the extension zone is of opposite conductivity type to the main emitter region.

The starting point is a monocrystalline semiconductor body having a major N-type region 50 as depicted in FIG. 4a. The semiconductor body typically consists of silicon but can be formed with other semiconductors such as germanium or gallium arsenide. The net N-type dopant concentration in major region 50 can be at a low level, as indicated by the use of "N−" in FIG. 4a, or at a moderate level. Region 50 may include one or more heavily doped N-type zones.

A field-isolation region 52 is formed along the upper surface of major region 50 according to a conventional technique. Although not completely shown in FIG. 4a, field-isolation region 52 fully laterally surrounds an upper portion of major region 50. In addition to extending into N-type region 50, field isolation 52 is illustrated as extending above region 50 to a height significantly less than the depth of isolation 52 into region 50. Nonetheless, the upper surface of isolation 52 could be considerably higher or lower than qualitatively depicted in FIG. 4a.

When major N-type region 50 consists of silicon, field-isolation region 52 is typically dielectric material such as silicon oxide. Alternatively, field isolation 52 could be an oxide-coated trench filled with a material such as polysilicon. Isolation 52 could also be semiconductor material of the same type (e.g., silicon) as region 50 except that isolation 52 is doped P type to create a PN-junction isolated structure. In these last two cases, the upper surface of isolation 52 is largely coplanar with the upper surface of region 50.

A P-type dopant is introduced into major region 50 through the portion of the upper semiconductor surface surrounded by field-isolation region 52 to form a moderately doped P-type precursor base region 54. A conventional doping technique is employed. For example, the location for P precursor region 54 could be established by ion implanting a suitable base dopant. The implantation may be performed through a protective layer (not shown) provided over the otherwise exposed portion of the upper semiconductor surface. An anneal may be done to activate the implanted P-type dopant, drive it further into region 50 if desired, and repair implant lattice damage. Alternatively, precursor base region 54 can be created by diffusion from a gaseous form of the P-type base dopant or by out-diffusion from an overlying P-type doping layer.

Field-isolation region 52 may adjoin the entire lateral periphery of precursor base region 54 along the upper semiconductor surface. The exemplary structure shown in FIG. 4a can represent this case. The lateral periphery of precursor base region 54 may also be partly or fully spaced apart from field isolation 52 along the upper semiconductor surface. If PN-junction isolation is used, precursor base region 54 needs to be spaced apart from isolation region 52.

A shielding layer 56, typically consisting of electrically insulating material, is formed along the upper surface of the structure as shown in FIG. 4b. Using a suitable photoresist mask, an opening 58 is etched through shielding layer 56 to expose a section 60 of the upper surface of precursor region 54. Opening 58 may be laterally spaced apart from field isolation 52. Alternatively, one or more parts of isolation 52 may be exposed through opening 58. Shielding layer 56 and any so exposed material of isolation 52 form a doping shield.

A pair of N-type doping operations, referred to here as the main-emitter doping and the extension-zone doping, are performed through opening 58 into base precursor region 54 to form the transistor's N-type emitter. The extension-zone doping furnishes the emitter with a more lightly doped extension zone for reducing the magnitude of the electric field along the emitter-base junction especially near the upper semiconductor surface. Although the extension-zone dopant is of the same conductivity type as the main emitter dopant, the lightly doped extension zone may be of the same conductivity type as, or of the opposite conductivity type to, the emitter depending on the doping levels of the base and extension-zone dopants.

Either of the two N-type doping operations may be initiated first. The specific sequence for the main-emitter and extension-zone dopings depends on features of the overall integrated-circuit fabrication process into which the present transistor fabrication technique is incorporated. FIG. 4c depicts an example in which the extension-zone doping is started first. An example in which the main-emitter doping is initiated before starting the extension-zone doping is described later.

As indicated in FIG. 4c, the extension-zone doping entails performing a highly oblique N-type ion implantation generally through section 60 of the upper semiconductor surface. The oblique N-type implantation is done at a tilt angle $\theta$ relative to the vertical—i.e., the direction generally perpendicular to the upper semiconductor surface. Tilt angle $\theta$ is at least 15°, preferably at least 20°, during the extension-zone implantation.

The N-type extension-zone dopant passes through surface section 60 into P precursor base region 54. A thin protective layer (not shown), through which the N-type dopant also passes, may be located along surface section 60 within opening 58. Except for small semiconductor surface areas extending along the edges of opening 58, the shield formed by shielding layer 56 and any parts of field-isolation region 52 exposed through opening 58 largely prevents the extension-zone dopant from passing through portions of the upper semiconductor surface not covered by the shield.

The implanted N-type extension-zone dopant is vertically distributed generally in a Gaussian manner in the semiconductor material dependent on the implant energy and dosage. The small "xs" in FIG. 4c represent the location of the peak concentration of the implanted extension-zone dopant. Due to the highly oblique nature of the extension-zone implant, part of the N-type dopant settles under shielding layer 56 along the edges of opening 58. This part of the extension-zone dopant is represented by the two "xs" to the left and the two "xs" to the right in FIG. 4c. The left-most "x" and the right-most "x" are raised slightly compared to the other "xs" to indicate that the maximum concentration of the implanted dopant bends slightly upward at the edges of the region containing the extension-zone dopant.

The extension-zone dopant consists of phosphorus, arsenic, or/and antimony when major region 50 is silicon. Preferably, phosphorus is used. The dosage is typically $1E12-1E16$ ions/cm$^2$.

Figure 9:
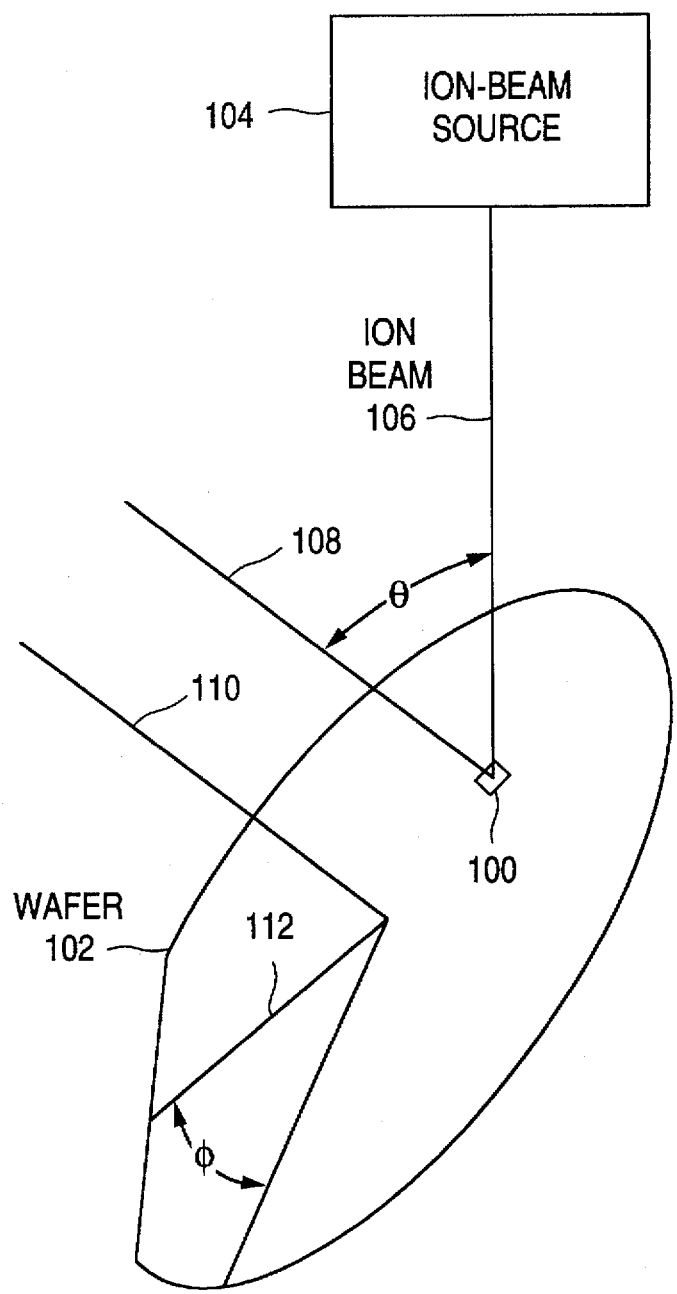
FIG. 9 is a simplified diagram of a wafer in an ion implantation system.

The extension-zone implant is done with an ion implantation apparatus having an ion source that provides a beam of ions in a given direction. Tilt angle $\theta$ is rotated in a prescribed manner, typically at a constant rotation rate, about a perpendicular to the upper semiconductor surface. This usually involves rotating the structure of FIG. 4c but can be done by moving the source of the ion beam through an appropriate path. The three-dimensional geometry for the rotation of tilt angle $\theta$ is illustrated in FIG. 9 discussed below.

During the extension-zone implant, the ion beam is two-dimensionally scanned in a relatively uniform manner across the upper surface of the transistor structure so that the implant dosage is relatively constant across the implanted region. The two-dimensional scanning is performed according to any of a number of conventional techniques. For example, the structure of FIG. 4c can be moved while the ion beam is fixed. Alternatively, the ion beam can be deflected or the source of the ion beam moved. Even further, both the ion beam and the structure of FIG. 4c can be moved.

In the exemplary process sequence illustrated by FIG. 4, the main N-type emitter doping is now done to form a surface-adjoining heavily doped main N-type region 64 of the emitter. See FIGS. 4d1 and 4d2. The main N-type emitter dopant passes through semiconductor surface section 60 into the underlying semiconductor material using the shield formed by shielding layer 56 and any part of field isolation 52 exposed through opening 58 to prevent the dopant from passing through portions of the upper semiconductor surface not covered by the shield. The dosage of the main-emitter dopant is greater than the dosage of the extension-zone dopant. N+ emitter portion 64 therefore consists primarily of the main-emitter dopant.

During the main-emitter doping, the N-type extension-zone dopant in precursor region 54 is typically activated to form a lightly doped extension zone along the side of main emitter region 64. The doping achieved with the N-type extension-zone dopant in the lightly doped extension-zone may, or may not, overcome the doping achieved with the P-type base dopant in the extension zone. That is, within the extension zone, the total of the doping level provided by the N-type extension-zone implant and the background N-type doping level of epitaxial layer 50 may, or may not, exceed the doping level provided by the P-type base dopant.

If the doping level provided by the extension-zone dopant is sufficiently high to overcome the doping level provided by the base dopant in the extension zone, the extension zone is formed as a lightly doped N-type zone 66. See FIG. 4d1. N− extension zone 66 laterally surrounds main emitter region 64. Although N− extension zone 66 is shown as a distinct region in FIG. 4d1, there is actually a progressive transition from main emitter region 64 to extension zone 66. In contrast to main emitter region 64 which consists primarily of the main-emitter dopant, extension zone 66 consists primarily of the extension-zone dopant. Main emitter region 64 and extension zone 66 together form the N-type emitter.

Figure 2:
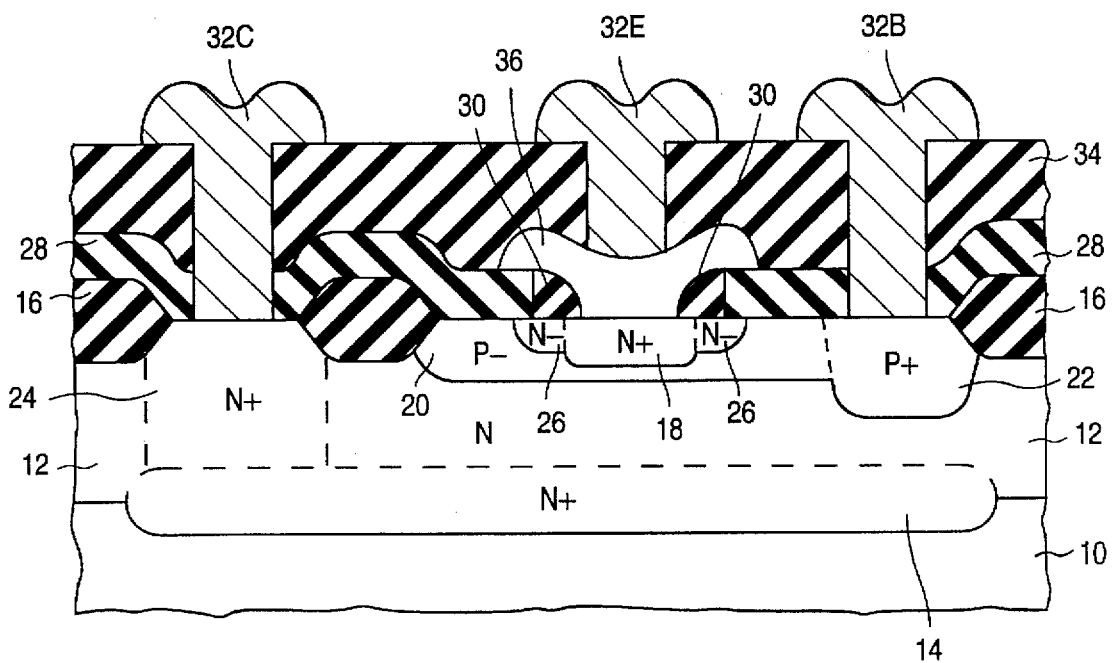
Figure 3A:
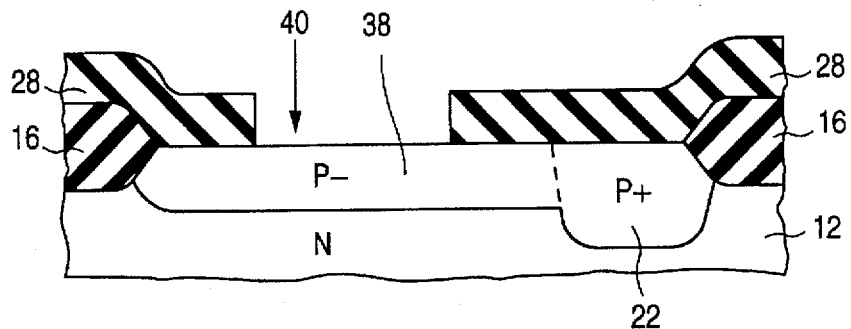
FIGS. 3a, 3b, 3c, and 3d are cross-sectional views that illustrate how the prior art transistor of FIG. 2 is provided with a lightly doped emitter extension.
Figure 3B:
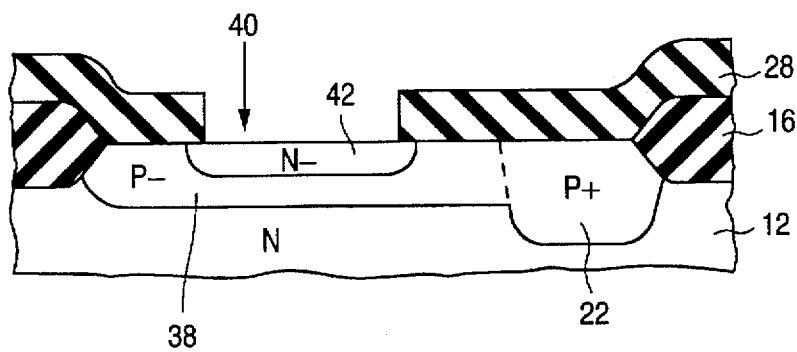
Figure 3C:
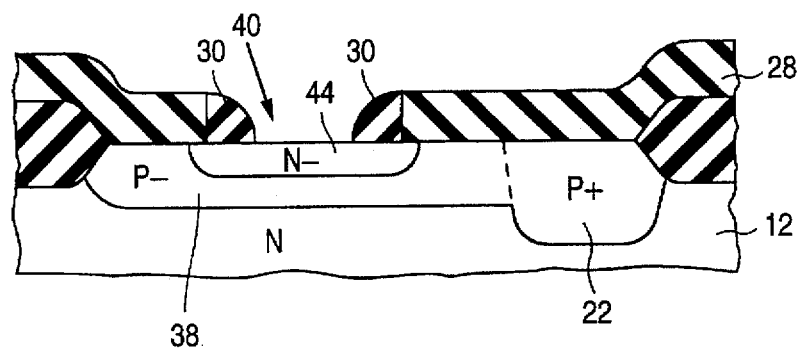
Figure 3D:
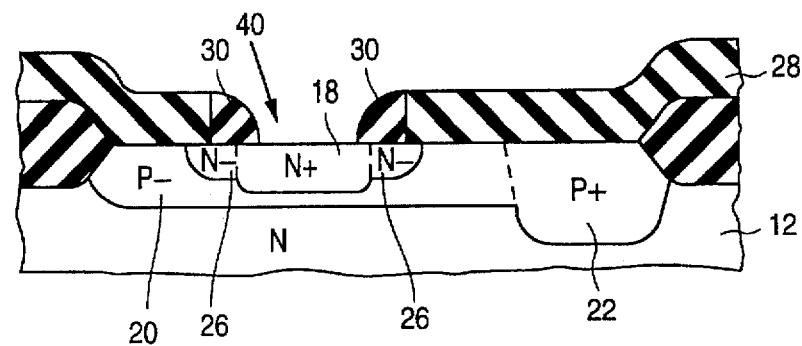

If the doping level furnished by the extension-zone dopant is not high enough to overcome the doping level furnished by the base dopant in the extension zone, the extension zone is formed as a lightly doped P-type zone 68. FIG. 4d2 depicts this case. As with N– extension zone 66 in FIG. 4d1, P– extension zone 68 in FIG. 4d2 laterally surrounds main emitter region 64. Consequently, main emitter region 64 constitutes the entire emitter. Adjoining P– extension zone 66 forms a lightly doped portion of the base.

Regardless of whether the extension zone is formed as N– zone 66 or P– zone 68, the combination of the main-emitter dopant and the oblique extension-zone implant basically defines the extension zone. In FIGS. 4d1 and 4d2, the extension zone is illustrated as being shallower than main emitter region 64. Nonetheless, extension zone 66 or 68 can extend to the same depth as, or deeper into the semiconductor body than, main emitter region 64.

The main-emitter doping operation typically entails ion implanting the main N-type emitter dopant at a suitably high dosage and then annealing the semiconductor body to activate the main emitter dopant and repair implant lattice damage. The main emitter implantation is performed in the vertical direction (i.e., zero tilt angle) relative to the upper semiconductor surface or at a small tilt angle, typically no more than 7°, relative to the vertical. The implant dosage is typically 1E15–1E16 ions/cm². Since the extension-zone dopant is already present in the semiconductor material, the extension-zone dopant is also activated during the anneal in this process sequence.

Alternatively, the main-emitter doping can be done by diffusion from a gaseous form of the main N-type emitter dopant or by out-diffusion from an overlying N-type doping layer formed in opening 58 along upper surface section 60. The N-type doping layer typically consists of N-doped non-monocrystalline silicon such as polysilicon. The high temperature present during the gaseous diffusion or out-diffusion step also serves to activate the extension-zone dopant and repair lattice damage.

The remainder 54R of P precursor base region 54 constitutes a main part of the transistor's P-type base. During the high-temperature step utilized in forming main emitter region 64, main base region 54R may expand somewhat in size. Base region 54 could also be formed after creating composite main emitter region 64. In either case, the net result is the structure of FIG. 4d1 or 4d2.

Main base region 54R connects through a heavily doped P-type base contact zone (situated outside the plane of FIGS. 4d1 and 4d2 and thus not shown in FIGS. 4d1 and 4d2) to an overlying external base contact (also not shown) formed atop the upper semiconductor surface. The portion of major region 50 underlying base region 54R constitutes at least part of the transistor's collector. In a typical configuration, the collector extends laterally beyond base region 54R and connects through a heavily doped N-type collector contact zone (not shown) to an overlying external collector contact (also not shown) provided atop the upper semiconductor surface. Alternatively, an external contact to the collector could be furnished from the bottom of the structure. An external emitter contact (not shown) overlies main emitter region 64.

Figure 5:
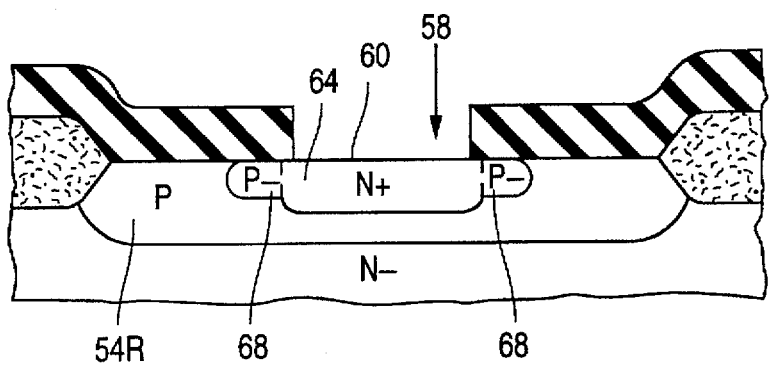
FIG. 5 is an expanded view of part of a composite of FIGS. 4c and 4d1 or 4d2 centering around the left-hand lightly doped extension zone.
Figure 5:
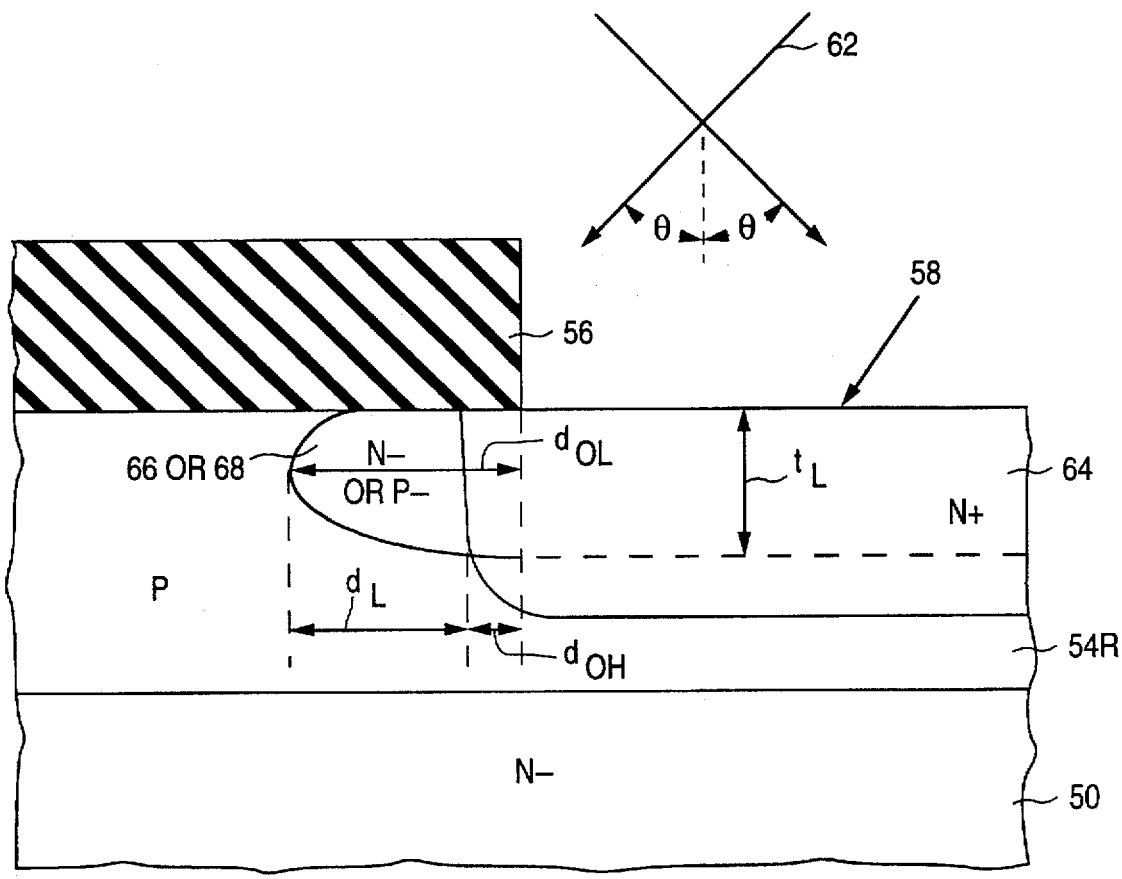

A composite of FIGS. 4c and 4d1 or 4d2 centering around the left-hand edge of opening 58 is shown in FIG. 5. The horizontal dashed line in FIG. 5 indicates the lateral extension of extension zone 66 or 68. The dimension $d_L$ of extension zone 66 or 68 in the lateral direction in FIG. 5 is the difference between the amounts $d_{OL}$ and $d_{OH}$ by which the left-most edges of extension zone 66 or 68 and main emitter region 64 are laterally offset from the edge of opening 58.

To a rough approximation, extension-zone offset $d_{OL}$ varies linearly with the sign of tilt angle θ. Similarly, the vertical thickness $t_L$ of extension zone 66 or 68 varies linearly with the cosine of tilt angle θ to a rough first approximation. Accordingly:

$$d_L \approx R_x \sin \theta - d_{OH} \quad (1)$$

$$t_L \approx R_y \cos \theta \quad (2)$$

where parameters $R_x$ and $R_y$ depend on the dosage and energy during the extension-zone implant. Parameters $R_x$ and $R_y$ are typically approximately equal.

Eqs. 1 and 2 show that the lateral dimension $d_L$ of extension zone 66 or 68 increases with increasing tilt angle θ, whereas vertical extension-zone thickness $t_L$ decreases with increasing tilt angle θ. Importantly, the lateral and vertical dimensions of each extension zone 66 or 68 are controlled by tilt angle θ and do not depend on the size and shape of any spacer used to offset main emitter region 64 from extension zone 66 or 68. This provides great flexibility in optimizing the transistor performance parameters as transistor dimensions are downscaled to increase device packing density.

Figure 6A:
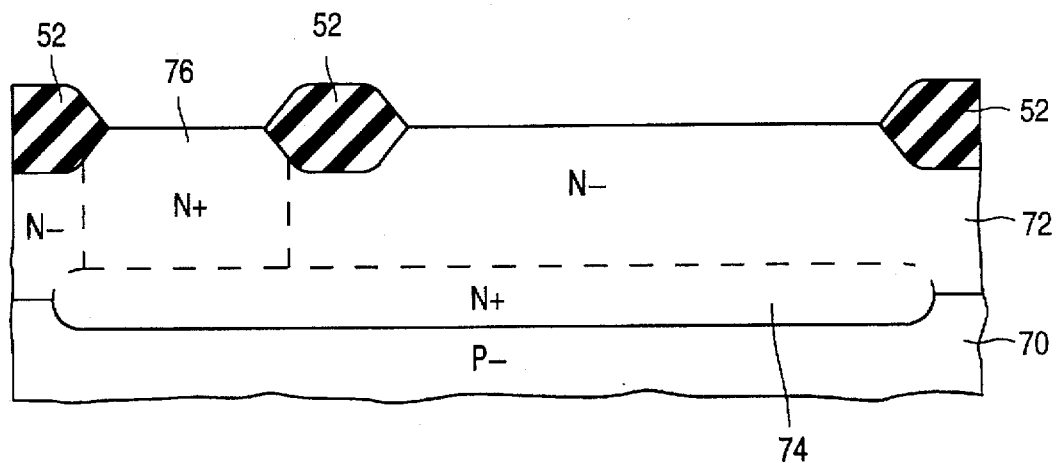
Figure 6B:
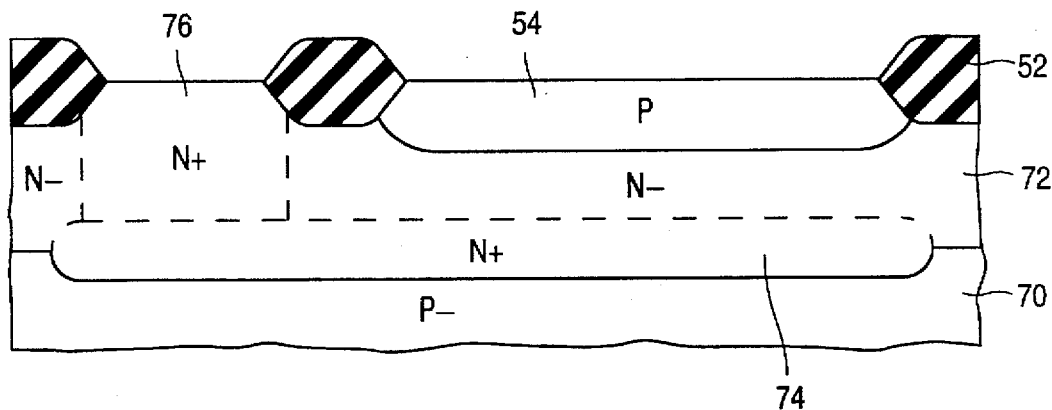

FIGS. 6a–6f, 6g1, 6g2, and 6h (collectively "FIG. 6") illustrate a more detailed implementation of the basic process of FIG. 4. FIG. 6g1 deals with the case in which N– emitter extension 66 is formed. FIG. 6g2 deals with the complementary case in which the extension zone is formed as P– zone 68.

In the implementation of FIG. 6, the semiconductor body consists of a lightly doped P-type monocrystalline silicon substrate 70 and an overlying lightly doped N-type epitaxial silicon layer 72. See FIG. 6a. A heavily doped N-type buried collector layer 74 is situated along the metallurgical interface between P– substrate 70 and N– epitaxial layer 72. Major region 50 in FIG. 4a is formed with N– epitaxial layer 72 and N+ buried layer 74 in FIG. 6a. Layers 72 and 74 are created according to conventional techniques.

Field-isolation region 52 consists of electrically insulating material, typically silicon oxide, that laterally surrounds a number of device portions of epitaxial layer 72. Two such epitaxial device portions are shown in FIG. 6a. A heavily doped N-type collector contact zone 76 extends through the left-hand epitaxial device portion down to buried layer 74. N+ collector contact zone 76 is formed according to a conventional technique. The height of field isolation 52 above the upper epitaxial surface is approximately the same as the depth of isolation 52 into epitaxial layer 72.

Using a suitable mask, the location of base precursor region 54 is defined by ion implanting boron into the right-hand device region. See FIG. 6b. Although the boron is normally not activated directly after the base implantation, item 54 in FIG. 6b generally indicates the location of the implanted base dopant. The base implantation is typically done at 1E14 ions/cm² and 120 KeV.

Figure 6C:
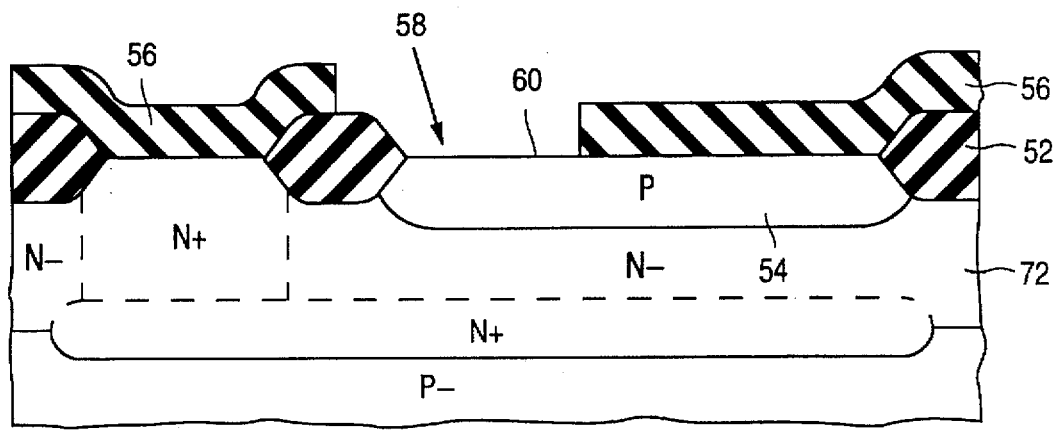

Shielding layer 56 is then deposited on the top of the structure, and opening 58 is etched through layer 56 to expose surface section 60 as shown in FIG. 6c. Shielding layer 56 typically consists of silicon oxide. Alternatively, layer 56 could be formed with photoresist. In this implementation, opening 58 exposes part of field-isolation region 52, specifically the center-most portion in FIG. 6c.

Using the implant shield formed by shielding layer 56 and the portion of field isolation 52 exposed through opening 58, the main N-type emitter doping is initiated by implanting arsenic into the unshielded part of precursor base region 54.

Figure 6D:
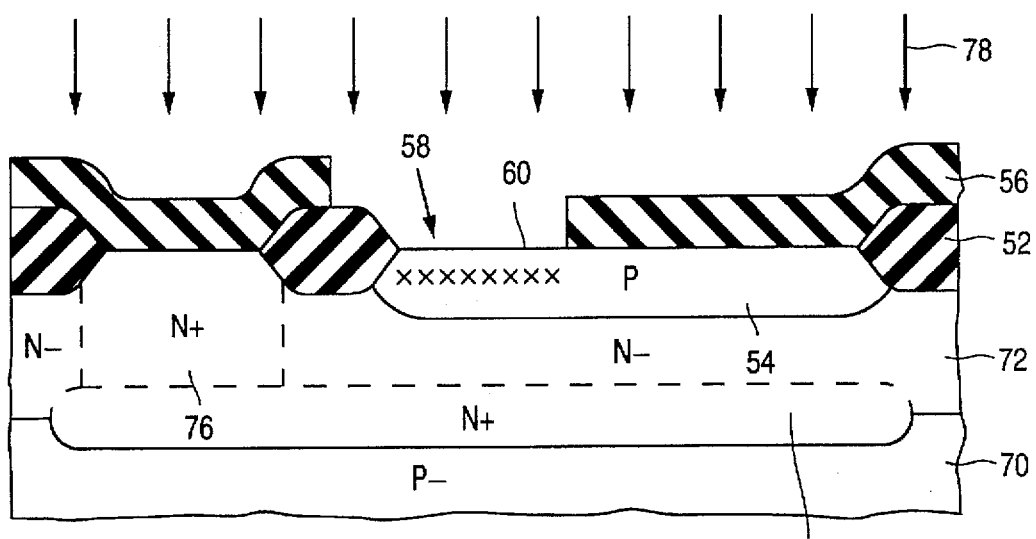

See FIG. 6d in which arrows 78 represent the main-emitter implantation. The implanted N-type dopant is vertically distributed in a generally Gaussian manner in the semiconductor material dependent on the implant energy and dosage. The small "xs" in FIG. 6d indicate the location of the peak concentration of the implant N-type dopant. The main emitter implantation is typically done at 8E15 ions/cm$^2$ and 80 KeV.

Figure 6E:
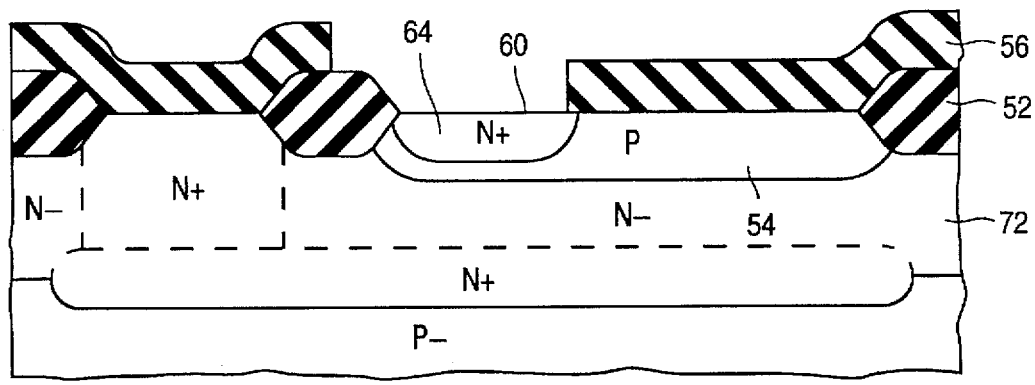
Figure 6F:
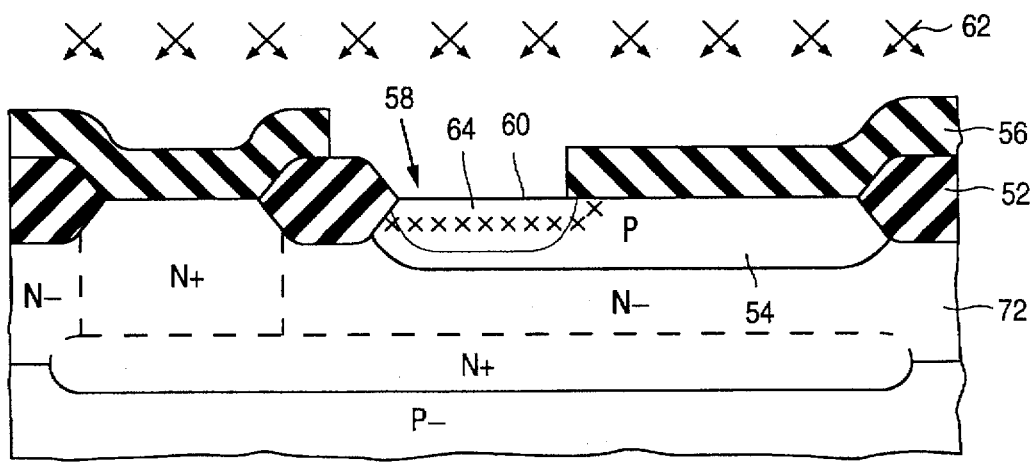

An anneal is performed to activate the main-emitter dopant and repair implant lattice damage. The activated main-emitter dopant becomes N+ main emitter region 64 as depicted in FIG. 6e. During the anneal, the implanted base dopant, if not previously activated, is also activated. The anneal is typically done for 15 minutes at 1000° C.

Next, the extension-zone implant is performed with phosphorus in the above-described manner at tilt angle $\theta$ of at least 15°, preferably 20° or more. See FIG. 6f. The combination of the N-type and P-type implant energies, the implant dosages, the tilt angle value, and the size of the opening through the composite doping shield formed by shielding layer 56 and the center-most portion of field isolation 52 largely determines the location of the extension-zone dopant. The center-most portion of isolation 52 limits the lateral extension of the extension-zone implant in this implementation. The extension-zone implant is typically done at 5E14 ions/cm$^2$ to produce N– extension-zone 66, or at 1E13 ions/cm$^2$ to create P– extension zone 68. The energy is 90 KeV in both cases.

At some point in the fabrication process of FIG. 6, a heavily doped P-type base contact zone 80 is created near the right-most portion of field-isolation region 52. Using a suitable photoresist mask, P+ base contact zone 80 can be defined by implanting boron into epitaxial layer 72 at a high dosage. An anneal is subsequently done to activate the implanted P-type dopant and repair lattice damage. The anneal can be a separate step or part of another high-temperature operation.

Although base contact zone 80 is not shown in FIGS. 6a–6f, contact zone 80 could be formed prior to the N-type main-emitter and extension-zone implants and also prior to the P-type base implant. In any case, FIG. 6g1 illustrates how the structure appears after the formation of base contact zone 80 for the embodiment in which the extension zone is N– zone 66. FIG. 6g2 depicts the composite structure when the extension zone is P– zone 68. The locations of extension zones 66 and 68 are respectively shown in FIG. 6g1 and 6g2 even though their fabrication may not be complete at this stage. P– main base region 54R is again the remainder of precursor base region 54.

A relatively thick layer 82 of electrically insulating material is provided along the top of the structure as shown in FIG. 6h. Insulating layer 82 is typically formed by a reflow process at elevated temperature such that the upper surface of layer 82 is largely planar. If extension zone 66 or 68 is not fully defined before the reflow step, the high temperature during the reflow step activates the implanted extension-zone implant and repairs lattice damage. This completes the formation of extension zone 66 or 68. When shielding layer 56 consists of photoresist, it is removed subsequent to the extension-zone implant and does not appear in FIG. 6h.

Using a suitable photoresist mask, openings are etched through insulating layers 82 and 56 down to main emitter portion 64, base contact zone 80, and collector contact zone 76. Metallic contacts 84E, 84B, and 84C are provided respectively to regions 64, 80, and 76 by depositing a metallic layer on top of the structure and patterning the metallic layer using another photoresist mask. Prior to the metal deposition, thin metal silicide portions can be formed along the tops of regions 64, 80, and 76. The fabrication of the transistor in FIG. 6h is completed by depositing an appropriate passivating layer (not shown) on top of the structure and then etching pad openings through the passivating layer.

Figure 7A:
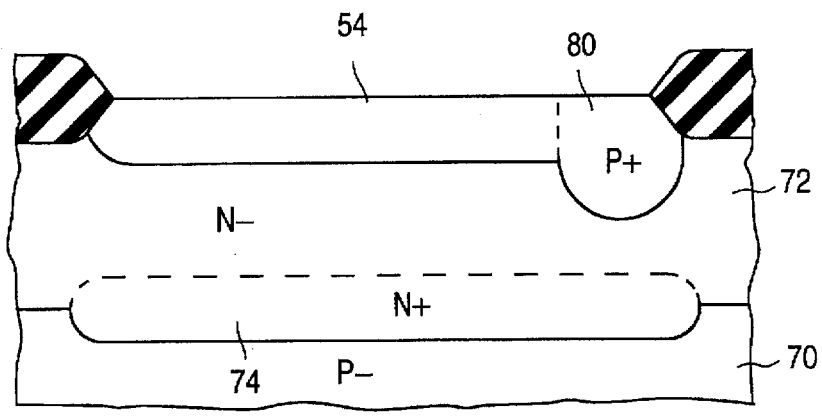
FIGS. 7a, 7b, and 7c are cross-sectional views of another specific implementation of the inventive process of FIGS. 4a–4c and 4d1.
Figure 7B:
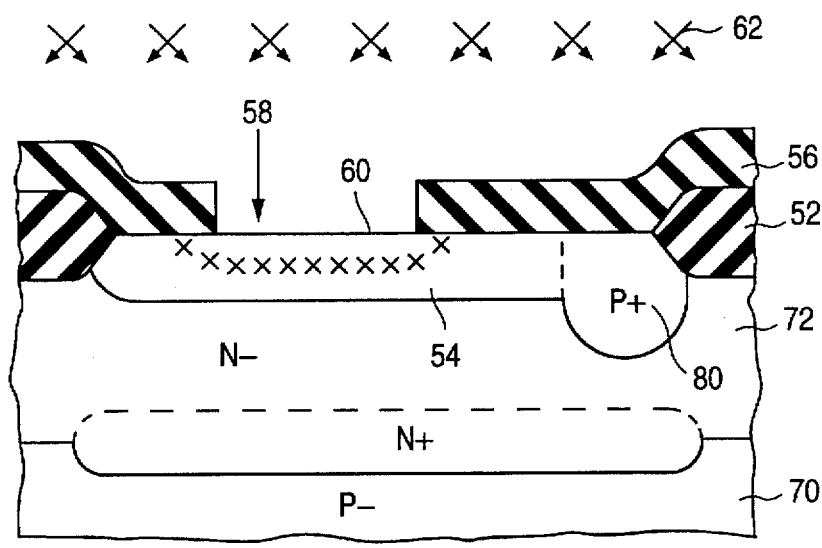
Figure 7C:
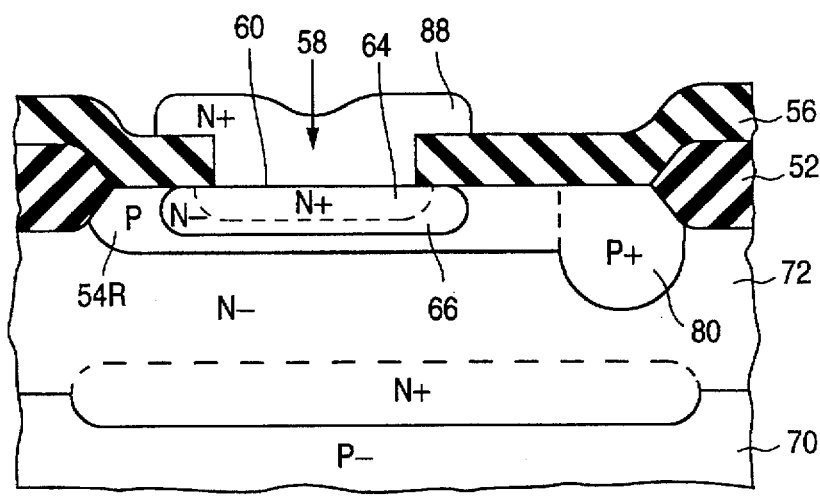

FIGS. 7a–7c (collectively "FIG. 7") depict a single-polysilicon implementation of the process of FIGS. 4a–4c and 4d1. The semiconductor body again consists of P– silicon substrate 70 and overlying N– epitaxial layer 72 with N+ buried layer 74 situated along the epi/substrate interface. At the stage shown in FIG. 7a, P precursor base region 54 and P+ base contact zone 80 have both been formed in epitaxial layer 72 by ion and subsequent annealing.

The NPN transistor being fabricated in the process of FIG. 7 is typically part of a BiCMOS device that contains N-channel and P-channel insulated-gate field-effect transistors ("FETs"). After forming shielding layer 56 along the upper semiconductor surface and etching opening 58 through layer 56 to expose surface section 60 of precursor base region 54, the oblique N-type extension-zone implant of the invention is performed. See FIG. 7b in which arrows 62 again represent the extension-zone implant and the small "xs" represent the mean depth of the implanted extension-zone dopant. The extension-zone implant is also similarly performed into transistor regions intended for N-channel insulated-gate FETs to form lightly doped drain regions for these FETs.

A layer of polysilicon is deposited on the upper surface of the structure and doped with a high level of a N-type dopant such as arsenic or phosphorus. Using a suitable photoresist mask, the heavily doped N-type polysilicon layer is patterned to form N+ polysilicon emitter contact 88 that covers surface section 60 and opening 58. FIG. 7c shows the resulting "poly emitter" structure. Other portions (not shown) of the N+ polysilicon layer are used as electrical interconnects in the integrated circuit being fabricated.

An anneal is performed to cause part of the N-type dopant in polysilicon emitter contact 88 to diffuse downward and form N+ main emitter region 64. During the anneal, the implanted extension-zone dopant is activated. In the transistor FIG. 7c, the extension-zone dopant is sufficient to overcome the base dopant. Consequently, the extension zone is N– zone 66. As shown in FIG. 7c, extension zone 66 extends deeper into the semiconductor body than main emitter region 64 in this implementation.

FIGS. 8a–8e (collectively "FIG. 8") illustrate a double-polysilicon implementation of the process of FIGS. 4a–4c and 4d2. The semiconductor body consists of P– substrate 70, N– epitaxial layer 72, and N+ buried layer 74 as described above. P precursor base region 54 has been formed by ion implantation and annealing at the stage depicted at FIG. 8a.

A first polysilicon layer 90 is deposited on the upper surface of the structure and doped with a high level of a P-type dopant, usually boron. See FIG. 8b. A layer 92 of electrically insulating material, typically silicon oxide, is deposited on P+ polysilicon layer 90. Using a photoresist mask, an opening 94 is etched through layers 90 and 92 down to precursor base region 54.

Figure 8A:
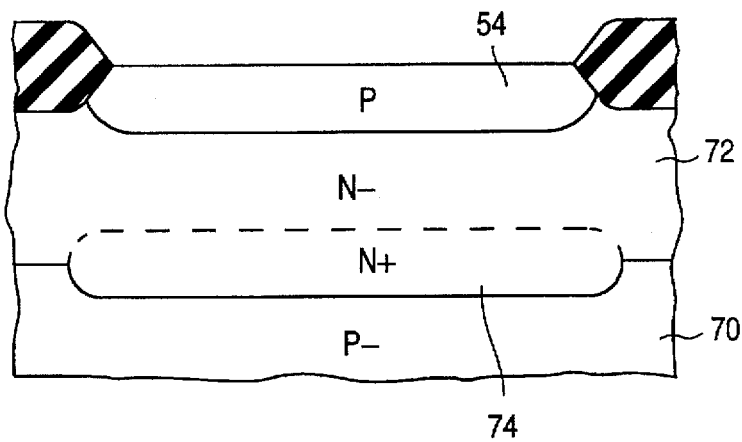
FIGS. 8a, 8b, 8c, 8d, and 8e are cross-sectional views of a specific implementation of the inventive process of FIGS. 4a–4c and 4d2.
Figure 8B:
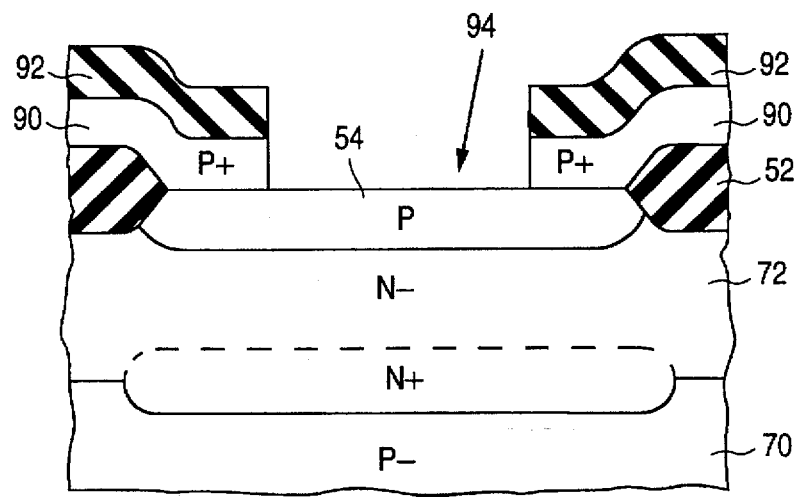
Figure 8C:
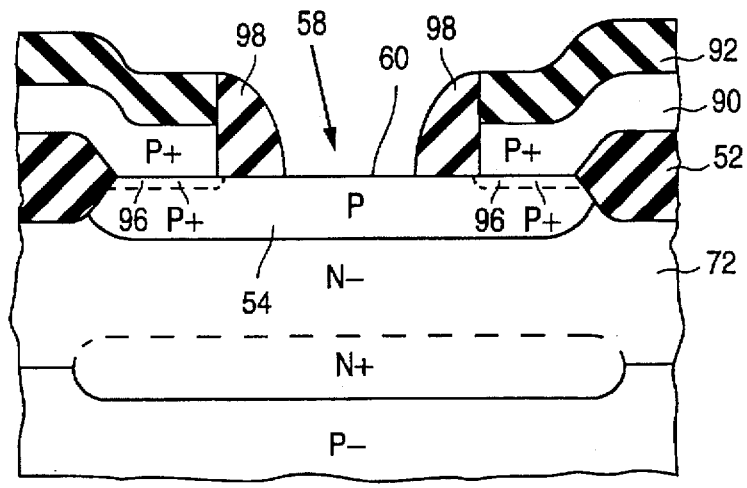
Figure 8D:
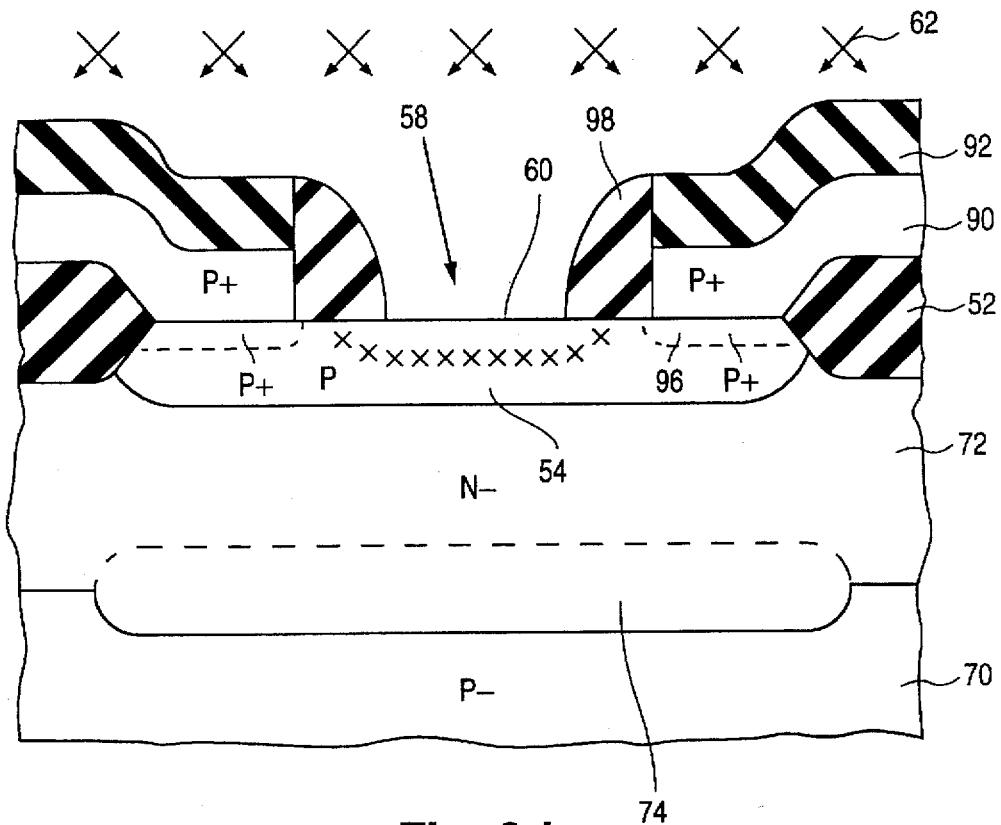

A second layer of insulating material, typically silicon oxide, is deposited on top of the structure at relatively low temperature. During a subsequent high-temperature operation, part of the P-type dopant in first polysilicon layer 90 out-diffuses to form a pair of heavily doped P-type base contact zones 96 as shown in FIG. 8c. The second layer of insulating material is anisotopically etched to remove substantially all of the second insulating layer except for a pair of oxide spacers 98 situated along the sides of opening 94. The region between spacers 98 constitutes opening 58 which exposes surface section 60.

The oblique implantation of the extension-zone implant is now performed in the manner described above at a tilt angle of at least 15°, preferably at least 20°. See FIG. 8d in which the extension-zone ions 62 pass through section 60. The small "xs" in FIG. 8d indicate the mean depth of the implanted extension-zone dopant. The process of FIG. 8 is also part of a BiCMOS integrated-circuit process. The extension-zone implant is simultaneously used to create lightly doped drain extensions for N-channel insulated-gate FETs.

Figure 8E:
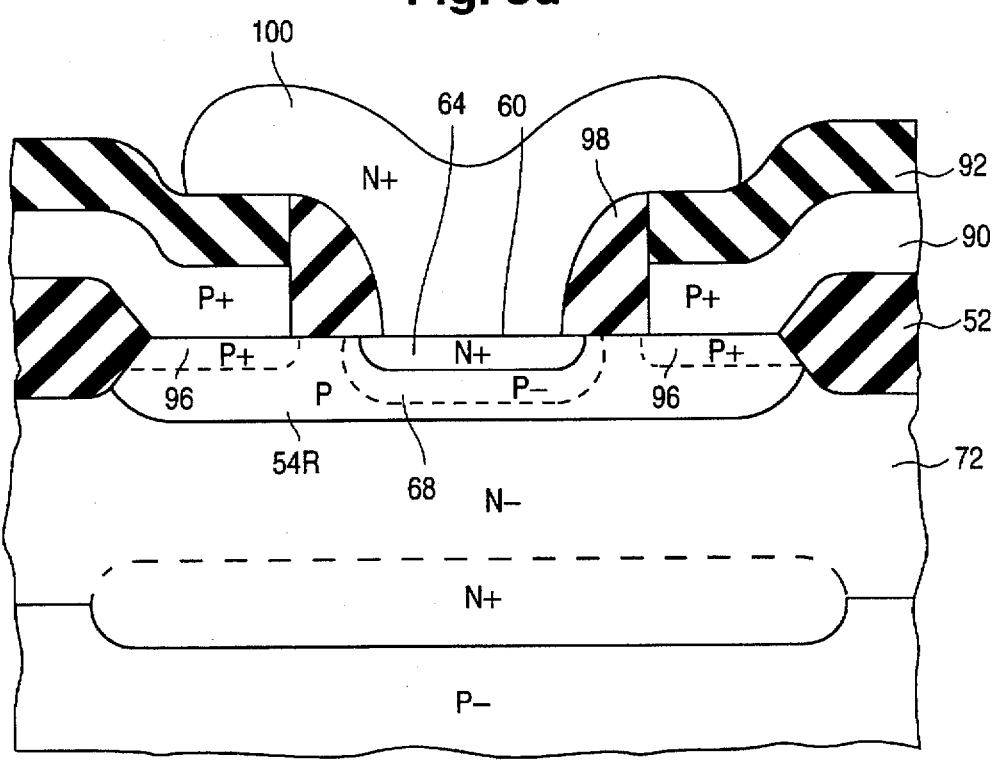

A second polysilicon layer is deposited on the upper surface of the structure and doped with a high level of an N-type dopant, typically arsenic or phosphorus. Using a suitable photoresist mask, the second polysilicon layer is patterned to create a heavily doped N-type polysilicon emitter contact 100 that covers surface section 60 and opening 58. The resulting "double poly emitter" structure is shown in FIG. 8e.

An anneal is performed to drive part of the N-type dopant in N+ polysilicon emitter contact 100 downward into precursor base region 54. N+ main emitter region 64 is thereby formed. In this implementation, the doping level of the extension-zone implant is not sufficient to overcome the base dopant. Consequently, the extension zone is created as P− zone 68. Again, the lightly doped extension zone extends deeper into the semiconductor body than main emitter region 64.

FIG. 9 illustrates how the emitter extension implant is performed at rotating tilt angle θ. The bipolar transistor being implanted according to the invention is part of a semiconductor die 100 that forms part of a semiconductor wafer 102. An ion-beam source 104 provides an ion beam 106 at tilt angle θ to a perpendicular 108 to the upper surface of wafer 102. During the extension-zone implant, wafer 102 is rotated about a perpendicular 110 to the upper wafer surface. The amount of rotation is measured counterclockwise by a twist angle φ defined relative to a selected radius 112 of wafer 102. The rotation rate thus is dφ/dt.

While the invention has been described with reference to particular embodiments, this description is solely for the purpose of illustration and is not to be construed as limiting the scope of the invention claimed below. For example, semiconductor materials of opposite conductivity type to those described above may be utilized to achieve similar results. A vertical PNP transistor having a lightly doped P-type or N-type extension zone alongside the main emitter region can thus be fabricated.

During the extension-zone implant, tilt angle θ could be varied rather than being held constant. Instead of varying twist angle φ at a constant rate to achieve a constant rotation for tilt angle θ, twist angle φ could be set at one or more fixed values, especially in fabricating bipolar transistors where semiconductor regions are laid out in lines running parallel and perpendicular to one another. For instance, arrows 62 in FIG. 4c could represent two fixed values of twist angle φ differing by 180°. Ions would typically be implanted at the two φ values for equal time periods. More generally, the extension-zone implant could be done for selected, typically equal, time periods at 2n values of twist angle φ differing by 180°/n where n is a positive integer.

Field-isolation region 52 in the processes of FIGS. 6–8 could extend all the way down to N+ buried region 74. Polysilicon layer 88 in the process of FIG. 7 and polysilicon layers 90 and 100 in the process of FIG. 8 could alternatively be formed with another type of non-monocrystalline silicon such as amorphous silicon; in the case of amorphous silicon, high-temperature steps that follow deposition of the amorphous silicon normally cause it to be converted to polysilicon. Various modifications and applications may thus be made by those skilled in the art without departing from the true scope and spirit of the invention as defined in the appended claims.

We claim:

1. A method comprising the steps of introducing first and second dopants of like conductivity type into a semiconductor body having an upper surface to form a surface-adjoining emitter of a bipolar transistor, both dopants being introduced into the semiconductor body upon passing through largely the same opening in a doping shield formed on the semiconductor body's upper surface, the first dopant being so introduced at a greater dosage than the second dopant such that the emitter comprises a main emitter region constituted primarily with the first dopant, the step of introducing the second dopant entailing ion implanting the second dopant into the semiconductor body at a tilt angle of at least 15° relative to a direction generally perpendicular to the semiconductor body's upper surface, part of the second dopant being so implanted into an extension zone that extends laterally beyond the main emitter region and is of opposite conductivity type to the main emitter region.

2. A method as in claim 1 further including the step of introducing additional dopant into the semiconductor body to provide the transistor with a base that separates the emitter from material of the semiconductor body outside the base and emitter, the additional dopant being of opposite conductivity type to the first and second dopants, the base comprising a main region and a more lightly doped portion constituted with the extension zone.

3. A method as in claim 1 wherein the extension zone substantially laterally surrounds the main emitter region.

4. A method as in claim 1 wherein the step of introducing the first dopant is initiated before the step of introducing the second dopant.

5. A method as in claim 4 wherein the step of introducing the first dopant entails:
 ion implanting the first dopant into the semiconductor body; and
 subsequently annealing the semiconductor body before ion implanting the second dopant.

6. A method as in claim 5 wherein the first and second dopants respectively comprise arsenic and phosphorus.

7. A method as in claim 5 wherein the step of introducing the second dopant further entails annealing the semiconductor body subsequent to ion implanting the second dopant.

8. A method as in claim 1 wherein the step of introducing the second dopant is initiated before the step of introducing the first dopant.

9. A method as in claim 8 wherein the step of introducing the first dopant entails out-diffusing the first dopant from a doping layer provided over the semiconductor body's upper surface.

10. A method as in claim 9 wherein the doping layer comprises non-monocrystalline semiconductor material.

11. A method as in claim 10 wherein the non-monocrystalline semiconductor material comprises polysilicon or amorphous silicon.

12. A method as in claim 10 wherein the doping layer forms a contact to the emitter.

13. A method as in claim 1 wherein the ion implanting of the second dopant includes simultaneously rotating the semiconductor body relative to a source of the second dopant while maintaining the tilt angle in a specified range.

14. A method as in claim 13 wherein the tilt angle is maintained approximately constant as the semiconductor body is rotated relative to the source of the second dopant.

15. A method as in claim 1 wherein the ion implanting of the second dopant includes scanning a source of the second dopant across the semiconductor body's upper surface.

16. A method as in claim 1 wherein the tilt angle is at least 20°.

17. A method as in claim 1 wherein, during the step of introducing the second dopant, part of the second dopant is simultaneously ion implanted into a region of a field-effect transistor created from the semiconductor body.

18. A method as in claim 17 wherein the introduction of the second dopant in the region of the field-effect transistor is used in creating a lightly doped drain extension for the field-effect transistor.

19. A method comprising the steps of introducing first and second dopants of like conductivity type into a semiconductor body having an upper surface to form a surface-adjoining emitter of a bipolar transistor, both dopants being introduced into the semiconductor body upon passing through largely the same opening in a doping shield formed on the semiconductor body's upper surface, the steps of introducing the first and second dopants entailing ion implanting the first and second dopants respectively at first and second tilt angles relative to a direction generally perpendicular to the semiconductor body's upper surface, the first dopant being so introduced at a greater dosage than the second dopant such that the emitter comprises a main emitter region constituted primarily with the first dopant, part of the second dopant being so introduced into an extension zone that extends laterally beyond the main emitter region and is of opposite conductivity type to the main emitter region.

20. A method as in claim 19 wherein the transistor is provided with a base comprising a main portion and a more lightly doped portion constituted primarily with the extension zone.

21. A method as in claim 19 wherein the step of introducing the first dopant is initiated before the step of introducing the second dopant.

22. A method as in claim 21 wherein the step of introducing the first dopant includes annealing the semiconductor body between introducing the first dopant into the semiconductor body and implanting the second dopant into the semiconductor body.

23. A method as in claim 19 wherein the step of introducing the second dopant is initiated before the step of introducing the first dopant.

24. A method as in claim 19 wherein the second tilt angle is at least 15°.

25. A method as in claim 19 wherein the second tilt angle is at least 20°.

26. A method as in claim 19 wherein the second tilt angle is greater than the first tilt angle.

27. A method as in claim 19 wherein the extension zone substantially laterally surrounds the main emitter region.

28. A method comprising the steps of introducing first and second dopants of like conductivity type into a semiconductor body having an upper surface to form a surface-adjoining emitter of a bipolar transistor, the first and second dopants passing through at least partially overlapping sections of the semiconductor body's upper surface, the first dopant being so introduced at a greater dosage than the second dopant such that the emitter comprises a main emitter region constituted primarily with the first dopant, the step of introducing the second dopant (a) being initiated after the step of introducing the first dopant and (b) entailing ion implanting the second dopant into the semiconductor body at a tilt angle of at least 15° relative to a direction generally perpendicular to the semiconductor body's upper surface, part of the second dopant being so implanted into an extension zone that extends laterally beyond the main emitter region and is of opposite conductivity type to the main emitter region.

29. A method as in claim 28 wherein the transistor is provided with a base comprising a main portion and a more lightly doped portion constituted with the extension zone.

30. A method as in claim 28 wherein, during the step of introducing the second dopant, part of the second dopant is simultaneously ion implanted into a region of a field-effect transistor created from the semiconductor body.

31. A method as in claim 30 wherein the introduction of the second dopant in the region of the field-effect transistor is used in creating a lightly doped drain extension for the field-effect transistor.

32. A method as in claim 28 wherein the step of introducing the first dopant entails:
ion implanting the first dopant into the semiconductor body; and
subsequently annealing the semiconductor body before ion implanting the second dopant.

33. A method as in claim 32 wherein the first and second dopants respectively comprise arsenic and phosphorus.

34. A method as in claim 32 wherein the step of introducing the second dopant further entails annealing the semiconductor body subsequent to ion implanting the second dopant.

35. A method as in claim 28 further including the step of introducing additional dopant into the semiconductor body to provide the transistor with a base that separates the emitter from material of the semiconductor body outside the base and emitter, the additional dopant being of opposite conductivity type to the first and second dopants.

36. A method as in claim 28 wherein the extension zone substantially laterally surrounds the main emitter region.

37. A method as in claim 28 wherein the ion implanting of the second dopant includes simultaneously rotating the semiconductor body relative to a source of the second dopant while maintaining the tilt angle in a specified range.

38. A method as in claim 37 wherein the tilt angle is maintained approximately constant as the semiconductor body is rotated relative to the source of the second dopant.

39. A method as in claim 28 wherein the ion implanting of the second dopant includes scanning a source of the second dopant across the semiconductor body's upper surface.

40. A method as in claim 28 wherein the tilt angle is at least 20°.

* * * * *